United States Patent [19]

Jillie, Jr. et al.

[11] Patent Number: 4,808,259
[45] Date of Patent: Feb. 28, 1989

[54] PLASMA ETCHING PROCESS FOR MOS CIRCUIT PREGATE ETCHING UTILIIZING A MULTI-STEP POWER REDUCTION RECIPE

[75] Inventors: Don W. Jillie, Jr., Cupertino; Gerald Yin, San Jose; Glen Wada, Fremont, all of Calif.

[73] Assignee: Intel Corporation, Santa Clara, Calif.

[21] Appl. No.: 147,450

[22] Filed: Jan. 25, 1988

[51] Int. Cl.$^4$ .................... H01L 21/306; B44C 1/22; C03C 15/00; C03C 25/06
[52] U.S. Cl. ........................... 156/643; 134/2; 134/3; 134/28; 134/29; 134/30; 156/646; 156/651; 156/653; 156/657; 156/659.1; 156/662; 204/192.37; 252/79.1; 252/79.2; 252/79.5; 437/233; 437/238; 437/241; 437/228
[58] Field of Search .................. 156/5, 643, 646, 651, 156/653, 657, 659.1, 662; 204/192.32, 192.35, 192.37; 427/38, 39; 134/2, 3, 26, 28, 29, 30; 252/79.1, 79.2, 79.5; 437/34, 40, 41, 43, 52, 56, 228, 233, 235, 238, 241

[56] References Cited

U.S. PATENT DOCUMENTS

| | | | |
|---|---|---|---|
| 4,461,672 | 7/1984 | Musser | 156/651 X |
| 4,528,066 | 7/1985 | Merkling et al. | 156/643 |
| 4,662,059 | 5/1987 | Smeltzer et al. | 156/651 X |
| 4,690,728 | 9/1987 | Tsang et al. | 156/643 |
| 4,720,323 | 1/1988 | Sato | 156/651 X |
| 4,729,815 | 3/1988 | Leung | 156/653 X |

Primary Examiner—William A. Powell
Attorney, Agent, or Firm—Blakely, Sokoloff, Taylor & Zafman

[57] ABSTRACT

A method for etching of metal-oxide-semiconductor (MOS) devices utilizing a multi-step power reduction plasma etching recipe to reduce ion bombardment damage on the resulting surface. The multi-step power reduction recipe allows for reasonable throughput of wafers due to a relatively high etch rate at the upper layers of the surface followed by progressively lower power corresponding lower etch rates at the lower levels of the surface. The etching process is followed by a cleaning process to remove metallic contamination resulting from the plasma etching process to yield an excellent surface for growing low defect density MOS gate oxides with high dielectric integrity.

21 Claims, 1 Drawing Sheet

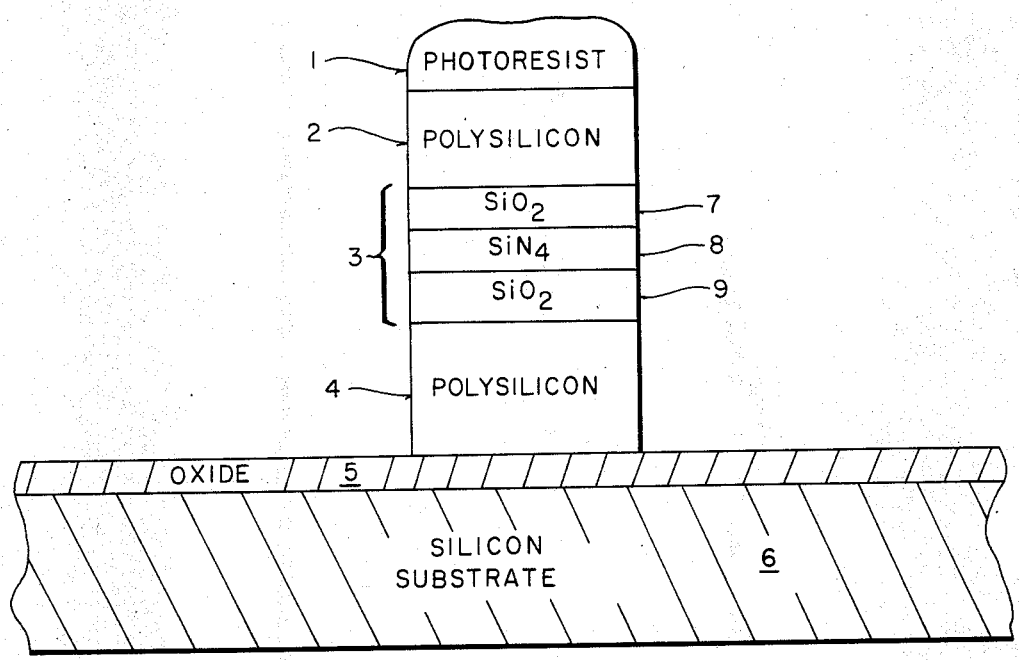
FIG_1
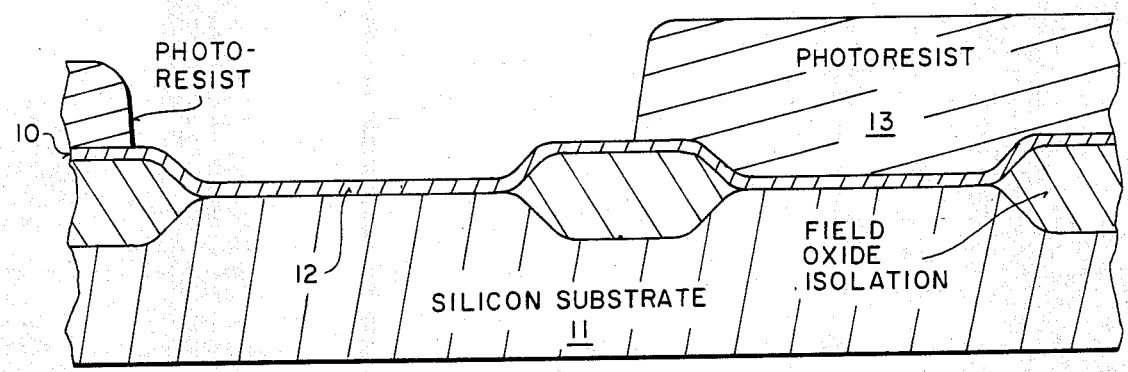
FIG_2

PLASMA ETCHING PROCESS FOR MOS CIRCUIT PREGATE ETCHING UTILIZING A MULTI-STEP POWER REDUCTION RECIPE

BACKGROUND OF THE INVENTION

1. Field of the Invention

This invention relates to the field of etching and cleaning processes for MOS devices and, more specifically, to the field of plasma etching and wet chemical cleaning for such devices.

2. Prior Art

In the field of etching processes for MOS circuits a number of methods are known in the art. Each of these methods has its own set of advantages and disadvantages. It is an object of the present invention to derive a process compatible with photoresist masking which allows etching of $SiO_2$, $Si_3N_4$ and oxynitride compounds with end point control, whereby the resulting silicon substrate surface quality yields a high quality and high integrity MOS gate oxide. Further, it is desired to have a reasonable throughput rate when utilizing the process.

One known method of etching semiconductor thin films and dielectrics is a wet etching process. One advantage of such a process is that a relatively high throughput is achieved. However, the method offers poor control of critical dimensions due to the isotropic nature of the process. Also, the method may leave chemical residues which can affect the integrity of oxides grown on the resulting surfaces.

A second well known method of etching employed in semiconductor processing is high power plasma etching, which offers anisotropic etching and relatively high throughput. However, the use of high powered plasma etching results in ion bombardment caused damage such as implanted species, lattice defects and dislocations in the etched surfaces.

Another known method of etching devices is the use of low power plasma etching which reduces the ion bombardment induced damage seen in a high powered plasma etching process. A low power plasma etching process suffers from the disadvantage of longer processing time which limits throughput.

Finally, it is known to use a high power plasma etching process followed by wet etching to eliminate the ion bombardment caused damage and retain some control of critical dimensions. This method introduces added processing steps and complexity and also may suffer from chemical residues on the etched surface.

SUMMARY OF THE INVENTION

A method for etching MOS devices utilizing a multiple step power reduction recipe and subsequent cleaning of the resulting surface is disclosed. The method results in a surface which allows growth of a high quality thin gate oxide with low defect levels. The method utilizes plasma etching giving good control of critical dimensions due to the anisotropic nature of such dry etching. Ion bombardment damage is reduced through use of the multi-step power reduction recipe.

It is further disclosed that the use of a cleaning procedure after the etching process is of great importance in yielding a surface upon which to grow a low defect density oxide. The preferred embodiment utilizes a sulfuric cleaning process followed by a modified version of the RCA standard clean process. The RCA standard clean process is described in "Hydrogen Peroxide Solutions for Silicon Wafer Cleaning", RCA Engineer, Volume 28-34, Pages 99-105, July/August 1983, by W. Kern.

It has been found that the disclosed multi-step power reduction recipe in combination with the disclosed cleaning processes are capable of providing a surface to grow thin oxides on in which the oxides are grown with a defect density approaching zero. In addition, the dielectric breakdown strength of these oxides is comparable to that attained using prior methods. The etch process may be applied to a variety of thin films including a thin nitride, thin oxide and oxide-nitride-oxide layers. In addition, the present invention may be utilized in either single wafer etchers or in batch etchers. More dramatic results may be seen in single wafer etchers because of their operation at higher power density than batch etchers.

BRIEF DESCRITPION OF THE DRAWINGS

FIGS. 1 and 2 are cross sectional views of portions of a MOS device which may be etched using the methods of the present invention.

DETAILED DESCRIPTION OF THE PRESENT INVENTION

A method for etching metal-oxide-semiconductor (MOS) devices utilizing a multi-step power reduction plasma etching recipe to reduce ion bombardment damage is described. In the following description, numerous specific details are set forth such as gas pressures, power levels, etc., in order to provide a thorough understanding of the present invention. It will be obvious, however, to one skilled in the art that the present invention may be practiced without these specific details. In other instances, well known techniques have not been shown in detail in order not to unnecessarily obscure the present invention.

A number of types of pregate dielectric etch have been encountered in metal-oxide-semiconductor (MOS) device processing including thin nitride etch, thin oxide etch and oxide-nitride-oxide (ONO) etch.

In the prior practice, a wet etch, such as hydrofluoric acid (HF) would be used to etch a thin oxide. However, in some instances it may be necessary or desirable to use a plasma etch, either in whole or in part, to prepare the pregate surface. However, the plasma etch introduces ion bombardment which causes substrate lattice damage in the active area where the gate oxide will grow. This problem varies in severity, but can be more severe in single wafer etchers, which operate at higher power density than batch etchers. It has been found that reducing the power used to etch the wafers reduces the ion bombardment caused damage. However, such a low power etch recipe suffers from low throughput of wafers. Plasma etching can also introduce surface contamination, particularly metallics such as aluminum, iron, nickel and chromium.

The present invention discloses a solution to the ion bombardment damage problem via application of a power down ramping recipe, whereby the upper portion o the pregate thin film is etched in a short period of time at a relatively high power. The power is then reduced while etching the lower portions of the pregate thin film and during over-etching into the substrate surface. A higher throughput of wafers can be achieved using this multi-step recipe as compared to a single step low power recipe.

A second factor in improving the etched surface quality/cleanliness has been found to be the clean processes following the plasma etch. Use of appropriate clean processes have at least as much effect on the defect density as the etch process. The present invention utilizes a variation on the standard RCA clean which is effective in removing organic and metallic contamination, and in leaving a surface upon which it is possible to grow gate oxide of defect density approaching zero having high dielectric integrity.

As stated previously, one application of the disclosed invention is removing oxide-nitride-oxide (ONO) layers without incurring damage to the resulting substrate surface. The present invention will be disclosed with specific reference to removal of such an ONO layer. It will be obvious to one of ordinary skill that the methods of the present invention are equally applicable to removal of other layers, such as thin oxide and thin nitride.

Referring now to FIG. 1, a composite ONO dielectric layer 3 as commonly used in HMOS non-volatile memory technologies for interpoly dielectric applications is illustrated. The ONO layer 3 typically comprises a first $SiO_2$ layer 7, an $Si_3N_4$ layer 8, and a second $SiO_2$ layer 9. As shown in FIG. 1, polysilicon layer 2 is patterned via conventional photolithography techniques to define the self-aligned MOS (SAMOS) etching of polysilicon layer 2, the ONO dielectric layer 3, and polysilicon layer 4. Oxide layer 5 acts as an etch stop to prevent etching into silicon substrate 6.

In some technologies, as a consequence of forming the ONO dielectric layer 3, it may be unavoidable to prevent ONO formation over active diffusion regions (i.e., directly on the silicon substrate 6). In such cases, it may be necessary to remove the unwanted ONO dielectric layer 3 over the active diffusion regions to facilitate subsequent MOS device processing (e.g., gate oxidation, polysilicon deposition, etc.).

Referring to FIG. 2, an ONO dielectric layer 10 with photoresist masking 13 is illustrated. The ONO dielectric layer 10 is in contact with an active diffusion region (i.e., directly in contact with silicon substrate 11). Removal of the unmasked ONO layer 10 from the active regions is desired.

As discussed previously, removal of the ONO dielectric layer 10 from area 12 is inhibited by several constraints. First, the etching process must be compatible with conventional photoresist processing. This constraint prohibits use of the most commonly used wet etchant, hot phosphoric acid, for removal of LPCVD nitride films. Second, the ONO etch process must preserve the intrinsic surface quality of the resulting silicon surface.

In general, the present invention discloses an etch process intended to etch the ONO dielectric layer 10, and to overetch into the silicon substrate 11 with a series of progressively lower power levels to reduce damage to the silicon substrate 11. Numerous power downramping recipes have been tested with varying degrees of effectiveness. An objective of such a recipe is to maintain a reasonable throughput rate and reduce ion bombardment caused damage to the resulting substrate surface.

One embodiment of the present invention utilizes a single wafer at a time plasma etcher with adjustable spacing between the electrodes. A first power level of approximately 275 watts and a pressure of 600 mT with a 0.8 cm gap setting and a flow rate of approximately 125 SCCM $C_2F_6$. After etching through the upper level of the ONO layer the power level is reduced to approximately 150 watts and etching continues until overetching into the substrate 11 is accomplished.

A second embodiment of the present invention involves a power downramping recipe utilizing four successively lower power levels beginning at 275 watts, lowering to 150 watts, then lowering to 100 watts and finally to 75 watts. This recipe results in a slightly lower oxide defect density. However, throughput is also reduced. This method is the presently preferred embodiment.

After the ONO layer 10 is removed by this etching process, the surface is cleaned. The cleaning process of the preferred embodiment utilizes a 30 minute plasma ash in oxygen ($O_2$) in a standard barrel type asher followed by a sulfuric/peroxide clean, also known in the art as a piranha clean. This clean is followed by a modified version of the the RCA Standard Clean cycles. As discussed above the RCA Standard Clean cycles, SC1 and SC2, are well known in the art. One description of these cycles may be found in "Hydrogen Peroxide Solutions For Silicon Wafer Cleaning" by W. Kern, RCA Engineer, Vol. 28-4, pages 99–105, July/August 1983.

The Standard Clean 1 cycle (SC1) is designed to promote oxidation and dissolution of organic impurities on the substrate surface in a solution of water ($H_2O$), ammonium hydroxide ($NH_4OH$) and hydrogen peroxide ($H_2O_2$) at a temperature of approximately 75° C. to 80° C. The Standard Clean 2 cycle (SC2) is designed to dissolve metallic impurities in a solution of water ($H_2O$), hydrochloric acid (HCl) and hydrogen peroxide ($H_2O_2$) at a temperature acid approximately 75° C. to 80° C. The preferred embodiment of the present invention utilizes these solutions at ambient temperature (typically 20°–40° C.) in a megasonic bath, which imparts a high frequency agitation to the solution.

It will be obvious, to one of ordinary skill in the art, that the present invention may be utilized in either single wafer etchers or in batch etchers. Further, it will be obvious that the benefits of the present invention are not limited to the specific processing parameters specified but may be found by utilizing alternative power downramping recipes with varying degrees of effectiveness. Further, it is appreciated that the teachings of the present invention be employed on a variety of surfaces when it is desired to grow a gate oxide with low defects and reasonable throughput rate.

Thus, a method for plasma etching a metal-oxide-semiconductor (MOS) device utilizing a power downramping recipe in order to reduce ion bombardment caused damage on the resulting substrate and a subsequent clean process which removes plasma etch induced metallic contamination and allows for growth of a gate oxide with a low defect density and high dielectric integrity is described.

We claim:

1. A method for pregate etching of a metal-oxide-semiconductor (MOS) thin film comprising the steps of:
   plasma etching said thin film at a first power level;
   plasma etching said thin film at a second power level, said second power level being lower than said first power level.

2. The method, as recited by claim 1, further comprising the step of cleaning a surface exposed by said etching.

3. The method, as recited by claim 2, wherein said cleaning comprises the steps of:

oxidation and dissolution of impurities on said surface in a first solution at a first temperature;

dissolution of remaining impurities in a second solution at a second temperature.

4. The method, as recited by claim 3, wherein said first solution comprises water ($H_2O$), ammonium hydroxide ($NH_4OH$) and hydrogen peroxide ($H_2O_2$).

5. The method, as recited by claim 4, wherein said first temperature is approximately 20°–40° C. and said clean is carried out in a megasonic bath.

6. The method, as recited by claim 5, wherein said second solution comprises water ($H_2O$), hydrochloric acid (HCl) and hydrogen peroxide ($H_2O_2$).

7. The method, as recited by claim 1, wherein said first power level is approximately 275 watts.

8. The method, as recited by claim 7, wherein said second power level is approximately 150 watts.

9. The method, as recited by claim 1, further comprising the steps of:

etching said thin film at a third power level lower than said second power level;

etching said thin film at a fourth power level lower than said third power level.

10. The method, as recited by claim 9, wherein said third power level is approximately 100 watts.

11. The method, as recited by claim 10, wherein said fourth power level is approximately 75 watts.

12. The method, as recited by claim 1, wherein said etching steps are done in a single wafer etcher.

13. The method, as recited by claim 1, wherein said etching steps are done in a batch etcher.

14. The method, as recited by claim 1, wherein said thin film is etched at a pressure of approximately 600 mT with an electrode spacing of approximately 0.8 cm and a flow of approximately 125 SCCM $C_2F_6$.

15. In a method for pregate etching thin film layers on a metal-oxide-semiconductor (MOS) device, said method utilizing a plasma etch, an improvement comprising etching at a series of progressively lower power levels.

16. The improvement, as recited by claim 15, wherein said etch occurs at a first power level of approximately 275 watts, followed by etching at a second power level of approximately 150 watts.

17. The improvement, as recited by claim 15, wherein said etching is followed by a clean process.

18. The improvement, as recited by claim 17, wherein said clean process comprises the steps of oxidation and dissolution of organic impurities on said surface in first solution of water ($H_2O$), ammonium hydroxide ($NH_4OH$) and 20° C. to 40° C. in a megasonic bath;

dissolution of remaining metallic impurities in a second solution comprising water ($H_2O$), hydrochloric acid (HCl) and hydrogen peroxide ($H_2O_2$) at a temperature of approximately 20° C. to 40° C.

19. In a method for pregate etching of thin film surfaces on a metal-oxide-semiconductor (MOS) device, said method comprising etching said device with a plasma etch, an improvement comprising the steps of:

etching said device at a first power level of approximately 275 watts, a pressure of approximately 600 mT, with a gap of approximately 0.8 cm and a flow of approximately 125 SCCM $C_2F_6$;

etching said device at a second power level of approximately 150 watts, a pressure of approximately 600 mT, with a gap of approximately 0.8 cm, and a flow of approximately 125 SCCM $C_2F_6$;

cleaning a resulting surface of said substrate in a first solution of water ($H_2O$), ammonium hydroxide ($NH_4OH$) and hydrogen peroxide ($H_2O_2$) at a temperature of approximately 20° C. to 40° C.;

further cleaning said substrate surface in a solution of water ($H_2O$), hydrochloric acid (HCl) and hydrogen peroxide ($H_2O_2$).

20. A method for plasma etching a thin film in a metal-oxide semiconductor (MOS) device comprising the steps of:

etching said device to remove said thin film;

cleaning the resulting surface, said cleaning comprising the steps of:

(a) oxidation and dissolution of a first set of impurities in a first solution, said oxidation taking place at ambient temperatures;

(b) dissolution of a second set of impurities at a second temperature, said oxidation taking place at ambient temperatures.

21. The method, as recited by claim 20, wherein said cleaning steps are done in a megasonic cleaning system.

* * * * *